(12) United States Patent
Leung et al.

(10) Patent No.: US 9,754,731 B2
(45) Date of Patent: Sep. 5, 2017

(54) METHOD OF PRODUCING DYE-SENSITIZED SOLAR CELL AND AN ELECTRODE OF A DYE-SENSITIZED SOLAR CELL

(71) Applicant: The Hong Kong Polytechnic University, Hung Hom, Kowloon, Hong Kong (CN)

(72) Inventors: Wallace Woon-fong Leung, Hong Kong (CN); Lijun Yang, Hong Kong (CN)

(73) Assignee: The Hong Kong Polytechnic University, Hong Kong (CN)

( * ) Notice: Subject to any disclaimer, the term of this patent is extended or adjusted under 35 U.S.C. 154(b) by 0 days.

(21) Appl. No.: 15/246,679

(22) Filed: Aug. 25, 2016

(65) Prior Publication Data

US 2017/0004928 A1    Jan. 5, 2017

Related U.S. Application Data

(62) Division of application No. 13/470,370, filed on May 14, 2012, now Pat. No. 9,455,093.

(51) Int. Cl.
*H01G 9/20* (2006.01)
*H01L 31/18* (2006.01)
(Continued)

(52) U.S. Cl.
CPC ......... *H01G 9/2059* (2013.01); *H01G 9/2063* (2013.01); *H01L 31/18* (2013.01);
(Continued)

(58) Field of Classification Search
CPC ...... H01G 9/20; H01G 9/2031; H01G 9/2036; H01G 9/2059; H01G 9/2063; H01G 9/2086
See application file for complete search history.

(56) References Cited

U.S. PATENT DOCUMENTS 7,396,580 B2    7/2008  Kawashima et al.
7,718,091 B2    5/2010  Zijp et al.
(Continued)

OTHER PUBLICATIONS

Fujihara et al.; "Spray deposition of electrospun TiO₂ nanorods for dye-sensitized solar cell", *Nanotechnology*, 18, pp. 1-5, (2007).
(Continued)

*Primary Examiner* — Susan D Leong
(74) *Attorney, Agent, or Firm* — Leydig Voit and Mayer

(57) ABSTRACT

A method of producing an electrode of a dye-sensitized solar cell includes dispersing semiconductor nanoparticles on a transparent electrically conductive substrate, dispersing semiconductor nanofibers on the semiconductor nanoparticle layer, adsorbing onto all sides of the semiconductor nanofibers a first light absorption material, thereby sensitizing the semiconductor nanofibers, wherein the light absorption material has a first light absorption bandwidth, and depositing a second light absorption material in contact with and forming respective shells on the respective semiconductor nanofibers on which the first light absorption material is adsorbed, wherein the second light absorption material has a second light absorption bandwidth complementary to the first light absorption bandwidth.

7 Claims, 12 Drawing Sheets

(51) Int. Cl.
  *B82Y 40/00* (2011.01)
  *H01L 51/00* (2006.01)
  *B82Y 30/00* (2011.01)

(52) U.S. Cl.
  CPC .............. *B82Y 30/00* (2013.01); *B82Y 40/00* (2013.01); *H01L 51/0078* (2013.01); *H01L 51/0086* (2013.01); *Y02E 10/542* (2013.01)

(56) References Cited

U.S. PATENT DOCUMENTS

| | | |
|---|---|---|
| 2005/0009224 A1 | 1/2005 | Yang et al. |
| 2006/0185714 A1 | 8/2006 | Nam et al. |
| 2008/0007852 A1 | 1/2008 | Kawasaki |
| 2008/0210302 A1 | 9/2008 | Gupta |
| 2009/0211638 A1 | 8/2009 | Park et al. |
| 2010/0221863 A1 | 9/2010 | Kim et al. |
| 2010/0307571 A1 | 12/2010 | Hardin et al. |
| 2011/0079275 A1 | 4/2011 | Qiao et al. |

OTHER PUBLICATIONS

O'Regan et al.; "A low-cost, high-efficiency solar cell based on dye-sensitized colloidal $TiO_2$ films", *Letters to Nature*, 353, pp. 737-740, (Oct. 10, 1991).

Maio et al.; "A New Type of Dye-Sensitized Solar Cell with a Multilayered Photoanode Prepared by a Film-Transfer Technique", *Adv. Matter*, 23, pp. 2764-2768, (2011).

Wang et al.; "A stable quasi-solid-state dye-sensitized solar cell with an amphiphilic ruthenium sensitizer and polymer gel electrolyte", *Nature Materials*, 2, pp. 402-407, (Jun. 2003).

Hamann et al.; "Advancing beyond current generation dye-sensitized solar cells", *Energy Environ. Sci.*, 1, pp. 66-78. (2008).

Yang et al.; "Application of a Bilayer $TiO_2$ Nanofiber Photoanode for Optimization of Dye-Sensitized Solar Cells", *Adv. Mater*, 23, pp. 4559-4562, (2011).

Nazeeruddin et al.; "Combined Experimental and DFT-TDDFT Computational Study of Photoelectrochemical Cell Ruthenium Sensitizers", *J. Am. Chem. Soc.*, 127, pp. 16835-16847, (2005).

Yang et al.; "Controlled growth of a molecular bulk heterojunction photovoltaic cell", *Nature Materials*, 4, pp. 37-41, (Jan. 2005).

Diamant et al.; "Core-Shell Nanoporous Electrode for Dye Sensitized Solar Cells: the Effect of the $SrTiO_3$ Shell on the Electronic Properties of the $TiO_2$ Core", *J. Phys. Chem. B*, 107, pp. 1977-1981, (2003).

Terao et al.; "Correlation of hole mobility, exciton diffusion length, and solar cell characteristics in phthalocyanine/fullerene organic solar cells", *Applied Physics Letters*, 90, 103515, (2007).

Kuang et al.; "Co-sensitization of Organic Dyes for Efficient Ionic Liquid Electrolyte-Based Dye-Sensitized Solar Cells" *Langmuir*, 23, pp. 10906-10909, (2007).

Kimura et al.; "Dye Molecules for Simple Co-sensitization Process: Fabrication of Mixed-Dye-Sensitized Solar Cells", *Agnew. Chem.*, 124, pp. 4447-4450, (2013).

Petritsch et al.; "Dye-based donor/acceptor solar cells", *Solar Energy Materials & Solar cells*, 61, pp. 63-72, (2000).

Grätzel, "Dye-sensitized solar cells", *J. of Photochemistry and Photobiology C: Photochemistry Reviews*, 4, pp. 145-153, (2003).

Shankar et al.; "Enhanced Harvesting of Red Photons in Nanowire Solar Cells: Evidence of Resonance Energy Transfer", *ACSNANO* vol. 3, No. 4, pp. 788-794, (2009).

Mor et al.; "High-Efficiency Förster Resonance Energy Transfer in Solid-State Dye Sensitized Solar Cells", *Nano Letters*, 10, pp. 2387-2394, (2010).

Lee et al.; "Highly Efficient Quantum-Dot-Sensitized Solar Cell Based on Co-Sensitization of CdS/CdSe", *Adv. Funct. Mater*, 19, pp. 604-609, (2009).

Hardin et al.; "Increased light harvesting in dye-sensitized solar cells with energy relay dyes", *Nature Photonics*, vol. 3, pp. 406-412, (Jul. 2009).

Cid et al.; "Molecular Cosensitization for Efficient Panchromatic Dye-Sensitized Solar Cells", *Agnew. Chem.*, 119, pp. 8510-8514, (2007).

Clifford et al.; "Multistep Electron Transfer Processes on Dye Co-sensitized Nanocrystalline $TiO_2$ Films", *J. Am. Chem. Soc.*, 126, pp. 5670-5671 (2004).

Law et al.; "Nanowire dye-sensitized solar cells", *Nature Materials*, vol. 4, pp. 455-459, (Jun. 2005).

Brown et al.; "Plasmonic Dye-Sensitized Solar Cells Using Core-Shell Metal-Insulator Nanoparticles", *Nano Letters*, 11, pp. 438-445, (2011).

Lee et al.; "Selective positioning of organic dyes in a mesoporous inorganic oxide film", *Nature Materials*, vol. 8, pp. 665-671, (Aug. 2009).

Chappel et al.; "$TiO_2$-Coated Nanoporous $SnO_2$ Electrodes for Dye-Sensitized Solar Cells", *Langmuir*, 18, pp. 336-3342, (2002).

Föster; "Transfer Mechanisms of Electronic Excitation Energy", *Radiation Research Supplement 2*, pp. 326-339, (1960).

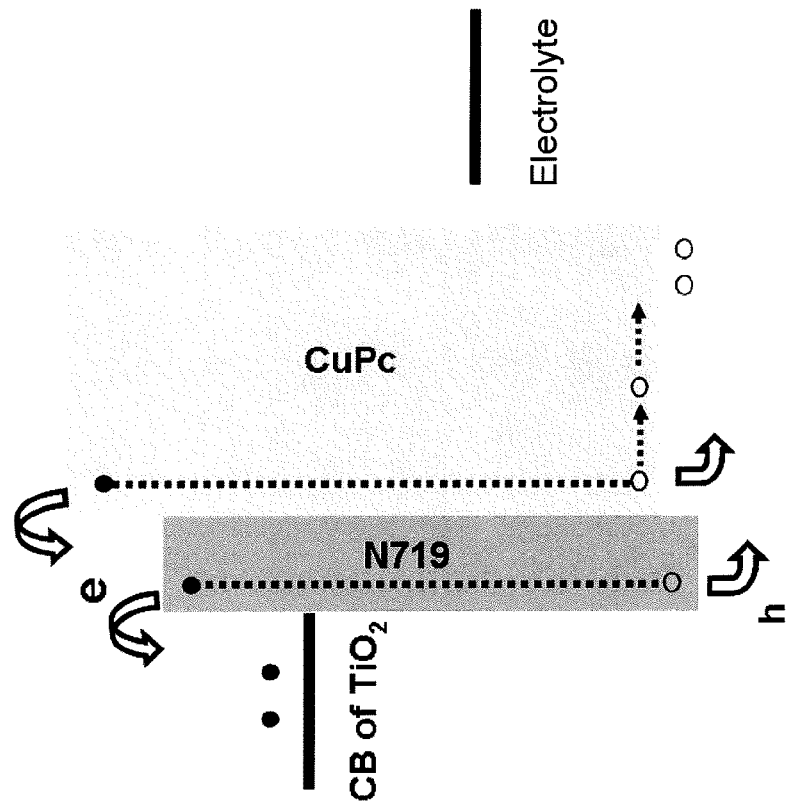
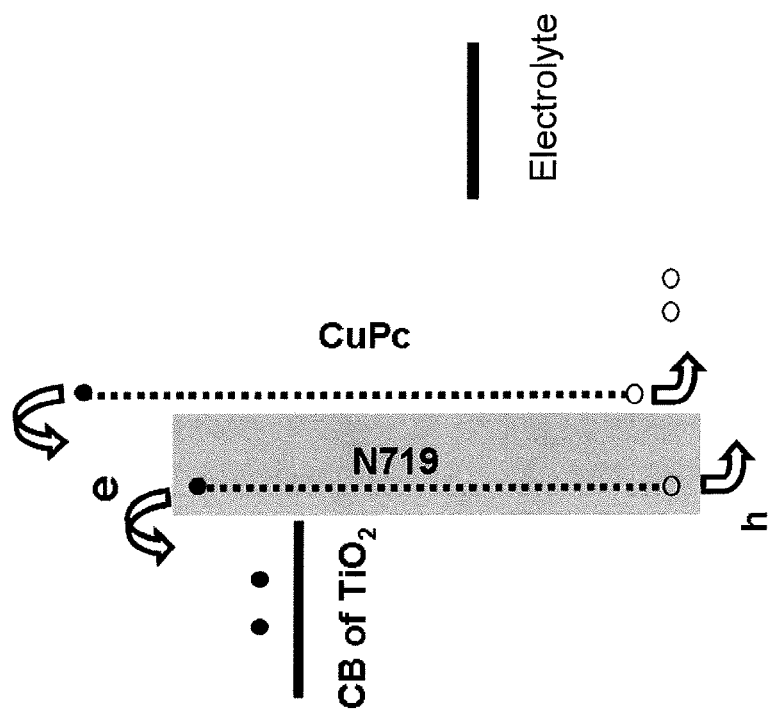
FIG. 3b
FIG. 3a

METHOD OF PRODUCING DYE-SENSITIZED SOLAR CELL AND AN ELECTRODE OF A DYE-SENSITIZED SOLAR CELL

BACKGROUND OF THE INVENTION

Field of the Invention

The present invention relates to a dye-sensitized solar cell that converts solar energy to electric energy, and more particularly, to dye-sensitized solar cells that include ultra-fine semiconductor fibers sensitized with more than one light absorption materials.

Description of the Related Art

Dye-sensitized solar cell (DSSC) is a non-conventional photovoltaic technology that attracted much attention due to its cost-effectiveness in harvesting solar energy with appealing properties such as flexibility, transparency, and adaptability in large-area devices. The operating principle of DSSC is illustrated in FIG. 12. Upon illumination, the dyes adsorbed onto the metal oxide semiconductor (usually $TiO_2$) are sensitized to the exited state (S*) by light absorption right at the interface and they dissociate readily to create an electron-hole pair, with electrons subsequently injected into the conduction band of the semiconductor while the holes, at least initially, remain on the sensitizers. The dye ground state (S) is then regenerated by electron donation from the redox system to the oxidized state of the sensitizer ($S^+$). The recuperation of redox system is realized by transporting holes to the counter electrode either in diffusion or hopping mechanism (depending on the transporting mediator). The whole process is finally completed by electron migration via the outer circuit and the device generates electric power from light without chemical transformation.

For decades, DSSC have become one of the most efficient and stable excitonic solar cells. A central feature of this device is utilizing photosensitizing dye that harvests light and generates excitons. In order to achieve high power conversion efficiency based on $I^-/I_3^-$ redox couple system which would be competitive with conventional silicon solar cells, DSSC must absorb as much as 80% of solar spectrum with wave length between 350 and 900 nm. While the traditional ruthenium-based dyes exhibit relative broad adsorption spectrum, it has difficulty in further improving its Power Conversion Efficiency (PCE) due to its low molar extinction coefficients.

Organic dyes, such as metallophthalocyanines (MPcs), shows higher molar extinction coefficient (100,000 $M^{-1}$ $cm^{-1}$), however, they have narrow absorption bandwidth. Complementally, dye cocktails or co-sensitization has been proposed to enhance the light absorption and extend the absorption spectrum. However, it has achieved only limited success to-date. This is probably due to (i) inferior injection efficiency caused by intermolecular interactions between dyes; (ii) confined surface areas of the photoanode for dyes to be absorbed. Considerable efforts have been made to solve these problems, one option is to separate the adsorption sites on $TiO_2$, which means achieving the proper position of each dye on the desired site, however, there is difficulty in realizing such a concept.

Recently, there have been some efforts on the use of Frster resonance energy transfer (FRET) in DSSC to enhance the light harvesting where an unattached, highly luminescent donor dye was inside the electrolyte to absorb high energy photons and efficiently transfer the energy to the anchored near-infrared acceptor dye. Unfortunately, $I_3^-$ in the electrolyte was found to partially quench the fluorescence of the donors, therefore only limited improvement in device performance can be achieved with such approach.

In view of the deficiencies of the conventional dye-sensitized solar cells, there is an increasing demand for high efficiency solar cells that are capable of harvesting a broader range of solar energy with improved power conversion efficiency.

SUMMARY OF THE INVENTION

According to one aspect, the present invention provides a dye-sensitized solar cell that includes an electrode having a semiconductor nanoparticle layer dispersed on a transparent conductive substrate, a plurality of semiconductor nanofibers dispersed on the nanoparticle layer, a first light absorption material is attached to the plurality of semiconductor nanofibers in which the first light absorption material having a first light absorption bandwidth, and a second light absorption material deposited on the first light absorption material of the plurality of semiconductor nanofibers, the second light absorption material having a second light absorption bandwidth complementary to the first light absorption bandwidth, a counter electrode includes a metal-coated transparent conductive substrate, and an electrolyte in contact with the second light absorption material and the counter electrode.

According to another aspect, the present invention provides a method of producing an electrode of a dye-sensitized solar cell, the method includes preparing a transparent conductive substrate, dispersing a plurality of semiconductor nanoparticles on the transparent conductive substrate, dispersing a plurality of semiconductor nanofibers on the semiconductor nanoparticle layer, sensitizing the semiconductor nanofibers with a first light absorption material in which the light absorption material having a first light absorption bandwidth, and depositing a second light absorption material on the first light absorption material, the second light absorption material having a second light absorption bandwidth complementary to the first light absorption bandwidth.

According to yet another aspect, the present invention provides a method of producing an electrode of a dye-sensitized solar cell, the method includes dispersing a plurality of semiconductor nanoparticles, dispersing a plurality of semiconductor nanofibers on the semiconductor nanoparticle layer, sensitizing the semiconductor nanofibers with a first light absorption material in which the light absorption material having a first light absorption bandwidth and an energy level higher than that of a conduction band of the semiconductor nanofibers, and depositing more than one light absorption materials, successively, in form of a shell structure on top of a preceding light absorption material, with each successive light absorption material having a higher energy level than the light absorption material in the preceding light absorption material.

Further features and aspects of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 3a illustrates the holes transfer process in DSSC with N719/CuPc sensitized $TiO_2$ nanofibers photoanode with a thinner CuPc shell.

FIG. 3b illustrates the holes transfer process in DSSC with N719/CuPc sensitized $TiO_2$ nanofibers photoanode with a thicker CuPc shell.

FIG. 11 illustrates photovoltage characteristic of DSSC devices with various thickness of CuPc.

DESCRIPTION OF THE EMBODIMENTS

The accompanying drawings, which are incorporated in and constitute a part of the specification, illustrate embodiments of the invention and, together with the description, serve to explain the principles of the invention.

DSSC offers the potential of low-cost, high-efficiency photovoltaic device. However, conventional DSSC cannot utilize all of the photons of the visible solar spectrum and consequently the realized power conversion efficiency (PCE) is limited. The present invention discloses a core-shell photoanode, where a thin shell of infrared dye is deposited on the core of sensitized $TiO_2$ nanofiber. In such architecture, photons are absorbed by the infrared dye and undergo charge transfer to the sensitizing dye, which broadens the absorption spectrum and suppresses the recombination process (electron back reaction and recombination with electrolyte ions). In one embodiment, ruthenium-based dye (N719) sensitized $TiO_2$ nanofibers are wrapped by thin-shell of copper phthalocyanine (CuPc) achieving a high efficiency of 9.48%. Rather than the typical Frster resonance energy transfer (FRET), the charge transfer between the CuPc and N719 molecules involves organized energy levels which can be explained by the microscopic more efficient indirect electron transfer process. Such an innovative approach provides an alternative method for enhancing the performance of DSSC for low-cost renewable energy generation in the future.

Figure 1:
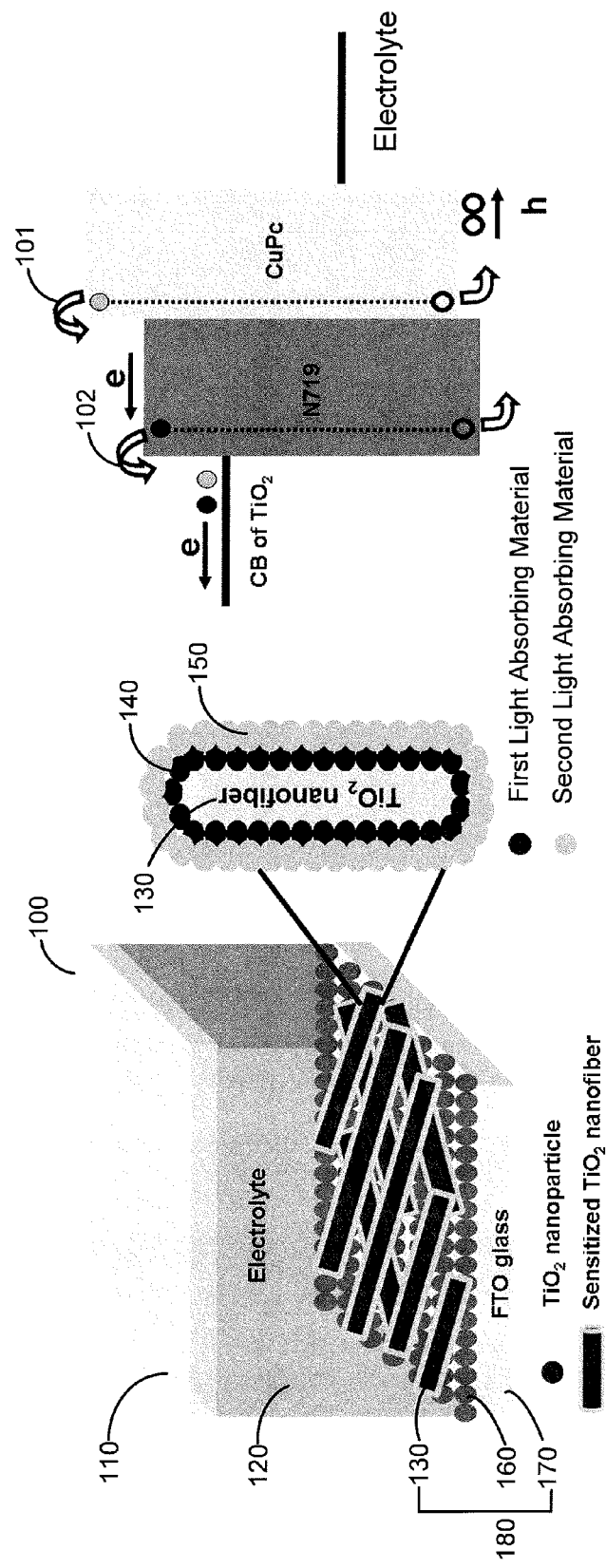
FIG. 1 illustrates a schematic of a semiconductor nanofiber dye-sensitized solar cell (DSSC) in accordance with one embodiment of the present invention.

FIG. 1 illustrates a schematic of a semiconductor nanofiber dye-sensitized solar cell (DSSC) in accordance with one embodiment of the present invention. Referring to FIG. 1, the DSSC 100 includes a semiconductor electrode (photoanode) 180 and a counter electrode 110 separated by electrolyte 120, which can be a liquid or a gel. The semiconductor electrode 180 comprises a transparent electrically conductive substrate (e.g. fluorine-doped tin dioxide (FTO) glass substrate), 170, a semiconductor nanoparticle layer 160, and a nanofiber layer 130. The counter electrode 110 can be produced with a variety of electrically conductive materials.

In one embodiment, the semiconductor nanofiber layer 130 is made with titanium dioxide ($TiO_2$) nanofibers which are adsorbed with a first light absorption material such as ruthenium-based dye molecules (e.g., N719, N709, N3, C101, etc.), and further deposited with a second light absorption material such as copper phthalocyanine (CuPc), zinc phthalocyanine (ZnPc), phthalocyanine sensitizers and other organic dyes (e.g. porphyrin sensitizers). The second light absorption material having a second light absorption bandwidth complementary to the light bandwidth of the first light absorption material.

The photoanode 180 and the counter electrode 110 are separated with a mediator such as electrolyte 120, which can take form of a liquid or a gel. In the latter case, an appropriate gelator such as poly (ethylene glycol), poly (methyl methacrylate), etc. is further added to gelate the electrolyte solution. The electrolyte may include iodide/triiodide, or others such as cobalt in form of Co(II)/(III), redox couple that is adapted to transport electrons from the counter electrode to the nanofiber layer to replenish the sensitized dyes. The counter electrode can be a platinum-sputtered FTO glass or an indium tin oxide (ITO) glass substrate. The counter electrode and dyes anchored $TiO_2$ photoanode is assembled into a sandwich structure with hot-melt film (Surlyn, DuPont, 25 micro m).

The composite electrode materials are composed of semiconductor nanofibers such as titanium dioxide nanofibers dispersed in a matrix which is coated with ruthenium-based dye molecules. Upon illumination, the ruthenium-based dye molecules are excited and created an electron-hole pair. Subsequently, the electrons are injected into the conduction band (CB) of $TiO_2$ photoanode. The average diameter of nanofibers is between 20-2,000 nm, with a preferred range of 30-100 nm. For the purpose of this disclosure, the diameter of a nanofiber refers to its cross-sectional diameter. As the cross-sectional of the nanofiber may not be circular, the equivalent diameter may equal to the average perimeter of the non-circular fiber divided by 3.14159.

For illustrative purposes, in the examples below, the term "dye" and "light absorption material" are used in a broad sense can be used interchangeably. For illustrative purposes, the examples below may use N719 (i.e., first light absorption material) and CuPc (i.e., second light absorption material) to describe light absorption material and near-infrared light absorption material, respectively. Thus, the examples should not be construed as limiting the scope of the present invention.

According to one embodiment, an ultrathin layer of CuPc is deposited on top of N719 sensitized $TiO_2$ nanofibers. The CuPc is capable of harvesting complementary light energy and creating electron-hole pairs, and subsequently, injecting the electrons to N719. As a result, it broadens the absorption bandwidth of DSSC which nearly covered the entire visible solar radiation spectrum.

There are two routes for charge generation and transfer in this system, which is illustrated in FIG. 1. Upon illumination, molecule of the light absorption material is excited and create an electron-hole pair, subsequently electron injects into the conduction band (CB) of $TiO_2$ photoanode (path 102). In the present DSSC design, the CuPc layer complementally absorbs near-infrared photon and creates an electron-hole pair, exciton. The lowest unoccupied molecular orbital (LUMO) energy level for CuPc is −3.5 eV. The exciton diffuses to the interface between CuPc and N719 molecules and dissociates due to the LUMO energy level which is offset at the interface. The electrons transfer to the LUMO of N719 initially (path 101) as the LUMO energy level for N719 is lower at −3.85 eV and subsequently inject into the CB of $TiO_2$ (at even lower energy level of −4.2 eV) via an indirect, more-efficient, charge transfer process. It is to be noted that the excitons is diffused or transported towards lower LUMO energy levels, and the light absorption material (in this case N719 with LUMO of −3.85 eV) is selected such that its energy level should be higher than the CB of the semiconductor nanofibers (−4.2 eV), while the near-infrared absorption materials should have LUMO energy level (in this case CuPc with LUMO of −3.5 eV) higher than the light absorption material for this indirect charge transfer process to take effect. If CuPc is replaced by another near-infrared light absorption material such as ZnPc with LUMO of −3.34 eV, this will also work as its LUMO is higher than N719 at −3.85 eV. To this end, the present invention relies critically on selecting the two light absorption materials according to their energy levels in respect to each other as well as to the CB of the semiconductor nanofiber.

In another embodiment, more than one light absorption material can be deposited on the semiconductor nanofibers, such as $TiO_2$ nanofibers with conduction band energy level of −4.2 eV. For example, N719 (with energy level of −3.85 eV which is higher than −4.2 eV corresponding to conduction band of $TiO_2$) sensitized $TiO_2$ nanofibers are deposited with a second light absorption material such as CuPc with LUMO energy level of −3.5 eV. Then, likewise, the second light absorption material is deposited with a third light absorption material having an even higher energy level, such as ZnPc with LUMO energy level of −3.34 eV, and so on. As such, each successive light absorption material forms a shell-like structure on the preceding light absorption material. Similarly, additional light absorption materials can be deposited with each successive light absorption material having a higher energy level than the light absorption material of the preceding adjacent light absorption material. Each of the successive light absorption material may have a corresponding light absorption bandwidth that is complementary to the light absorption bandwidth of the preceding light absorption material.

The present photoanode design has a number of advantages. First, the one-dimensional nano-materials (e.g. $TiO_2$ nanofibers) maintain the fast charge transport property. Second, the surface roughness of the fibers (polycrystallites less than 10 nm) is adapted for deposition of the light absorption material. Third, the high pore volume or porosity of the photoanode as composed by nanofibers (in contrast with less porous photoanode made up of nanoparticles) allows the second dye (CuPc) to be deposited deeply into the photoanode. Suitable technique for depositing the second dye include deep penetration method such as thermal, chemical, or physical vapor deposition which can permeate deeply in a porous structure, coating the light absorption materials (N719) of the semiconductor nanofibers ($TiO_2$). Fourth, the near-infrared light absorption material (e.g. CuPc) deposited in form of an ultrathin layer external to the N719 sensitized $TiO_2$ nanofiber photoanode can expand the absorption bandwidth while avoiding the competition of anchored sites on $TiO_2$ with the light absorption material. The latter has been a limiting factor heretofore with conventional co-sensitization. Fifth, two types of light absorption materials, or dyes, are spatially and energetically organized so as to achieve electrons transfer from near-infrared (outer layer) light absorption material to the first (inner layer) light absorption material while holes transfer from first light absorption material to the near-infrared light absorption material. This increases the distance between injected electrons and oxidized dye species (holes) thereby reduces, if not entirely suppresses, the recombination process between electrons and holes in the device.

Figure 2B:
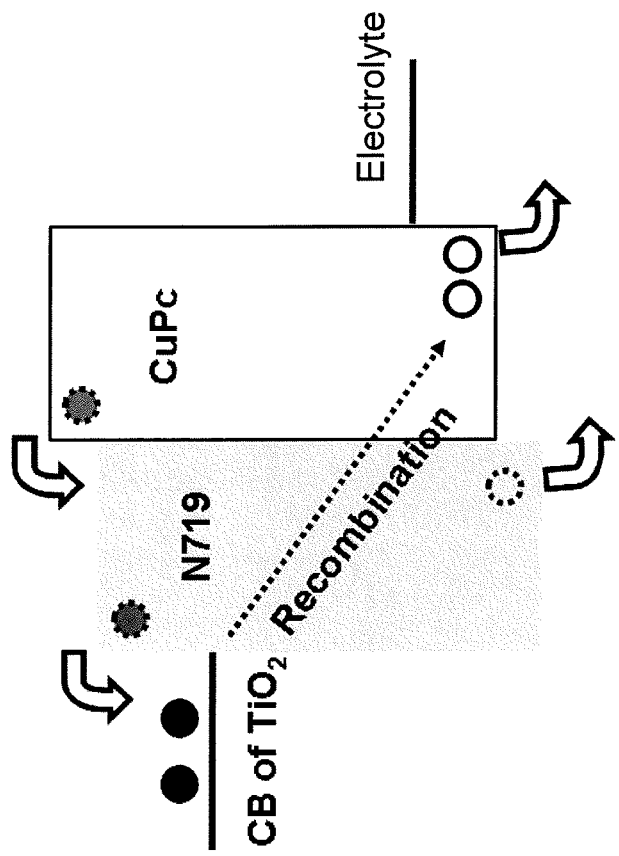
FIG. 2b schematically illustrates a recombination process in DSSC with CuPc deposition.
Figure 2A:
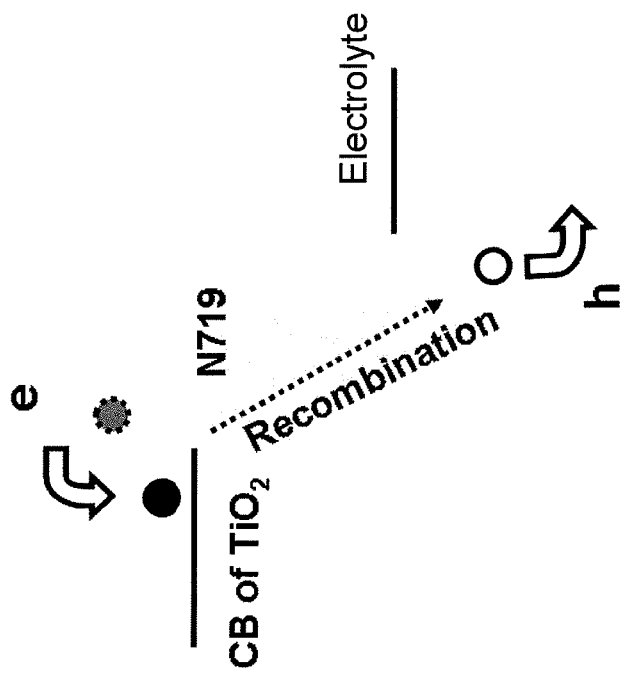
FIG. 2a schematically illustrates a recombination process in DSSC without CuPc deposition.

For the DSSC with non-solid (i.e. liquid and gel) electrolytes, recombination occurs between the electrons in the conduction band (CB) of $TiO_2$ with the holes in the oxidized dye as shown in FIG. 2a. Referring to FIG. 2b, the dye N719 and CuPc are spatially and energetically organized so as to achieve electron transfer from CuPc to N719 while holes transfer from N719 to CuPc. Consequently, the distance between injected electrons and holes is increased and thereby suppressing recombination process in the device.

FIGS. 3a and 3b schematically illustrate two different configurations of the present invention. FIG. 3a illustrates a holes transfer process in DSSC with N719/CuPc sensitized $TiO_2$ nanofibers photoanode with a thinner CuPc shell; FIG. 3b illustrates a holes transfer process in DSSC with N719/CuPc sensitized $TiO_2$ nanofibers photoanode with a thicker CuPc shell. When thickness of CuPc is less than or equal to the "sum" or "total" of the exciton diffusion length (i.e., length or distance of the diffusion region) and the thickness of excitons quenched region, the excitons diffuse to the interface of N719 and CuPc and subsequently dissociate. The electrons are injected into LUMO of N719 and are subsequently injected into CB of $TiO_2$. The holes can efficiently diffuse to the interface between CuPc and electrolyte. However, when the thickness of CuPc shell exceeds the "sum" or "total" of the length of exciton diffusion and the thickness of quench region (FIG. 3b), the excess CuPc induces extra resistance that retards the regeneration of the N719 due to the inferior holes transport ability.

Figure 4:
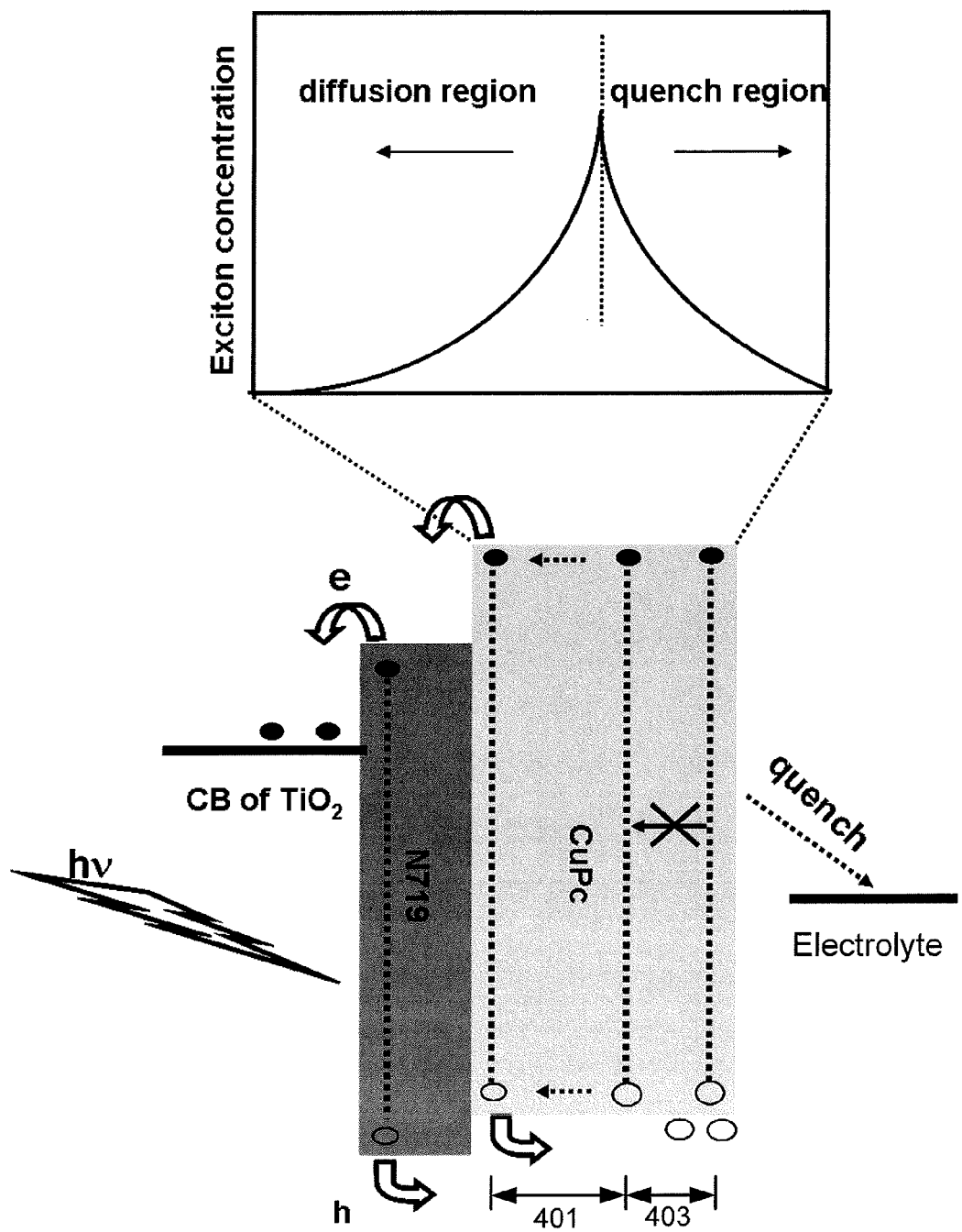
FIG. 4 illustrates a schematic of electrolyte quenching the excited state of the CuPc, and relationship between exciton concentration and distance from closer to N719 to away from N719.

FIG. 4 is a schematic of electrolyte ($I_3^-$) quenching the excited state of the CuPc, and relationship between exciton concentration with distance from closer to N719, to away from N719.

As is known, $I_3^-$ in electrolyte is a "perfect quencher", which is capable of quenching the excited state of CuPc thereby the outmost shell of CuPc, which is being quenched, becomes malfunction or sacrificed. As such, an appropriate shell thickness should be optimally equal to the sum of the exciton diffusion length (depending on the crystalline/non-crystalline structure of the near-infrared light absorption material) and the quench region thickness. The left region (401) is the exciton diffusion region, while the right region (403) is a quench region.

Figure 5:
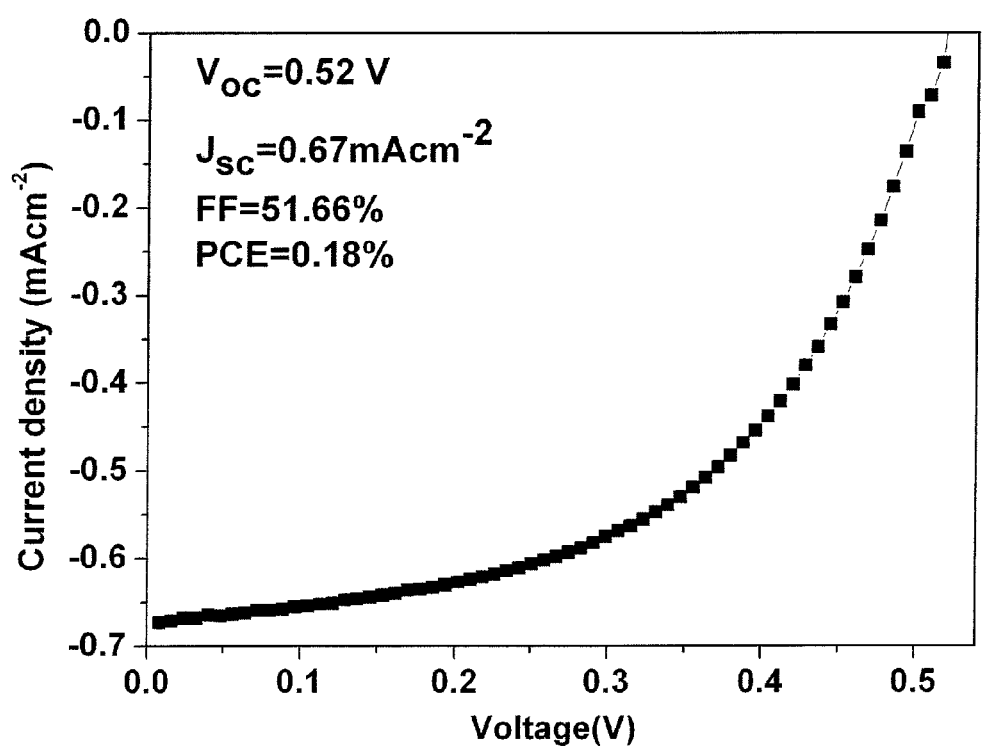
FIG. 5 illustrates a graph of photocurrent density vs. voltage (J-V) characteristic of device with a photoanode of $CuPc/TiO_2$.

FIG. 5 illustrates a graph of photocurrent density vs. voltage (J-V) characteristic of device with the photoanode of CuPc/TiO$_2$ under AM1.5 (100 mWcm$^{-2}$). It shows the realized current density J for a given voltage V with $J_{sc}$ corresponding to the short-circuit current density at zero voltage and $V_{oc}$ corresponding to the open-circuit voltage without current density. The maximum power from the DSSC device corresponds to a point (V, J) on the performance curve, whereby the power, which is a product of J and V becomes maximum. The fill factor, FF, expressed as a percent, is defined as the ratio of the maximum power to the product of theoretical power realized $J_{sc}V_{oc}$. Higher FF represents better maximum power obtained from the DSSC device.

Figure 11A:
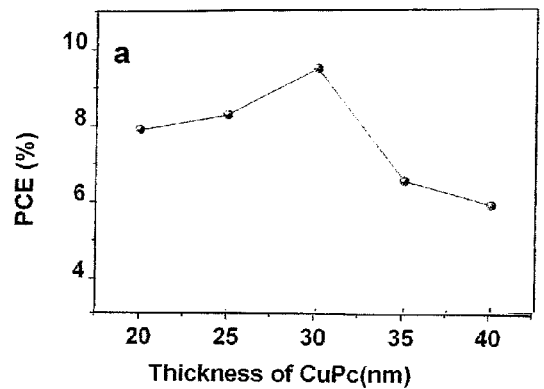
FIG. 11a is a graph that illustrates PCE versus various thickness of CuPc.
Figure 11B:
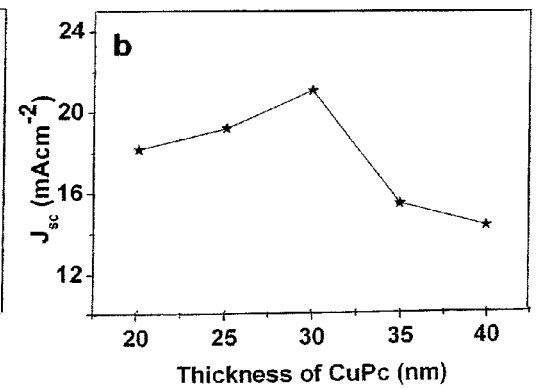
FIG. 11b is a graph that illustrates $J_{sc}$ versus various thickness of CuPc.
Figure 11C:
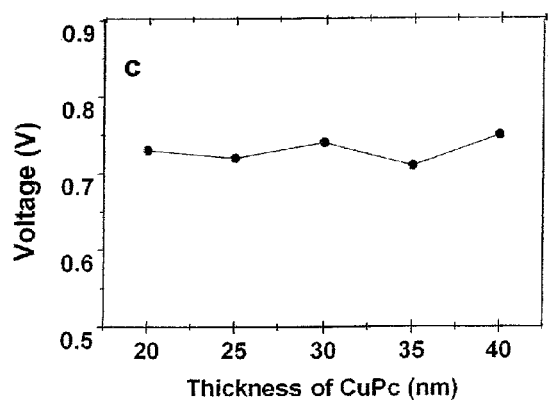
FIG. 11c is a graph that illustrates $V_{oc}$ versus various thickness of CuPc.
Figure 11D:
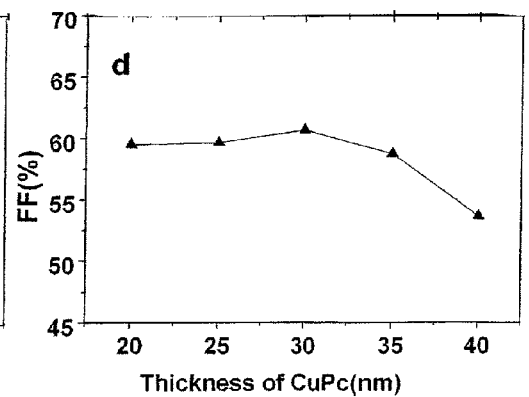
FIG. 11d is a graph that illustrates FF versus various thickness of CuPc.
Figure 12:
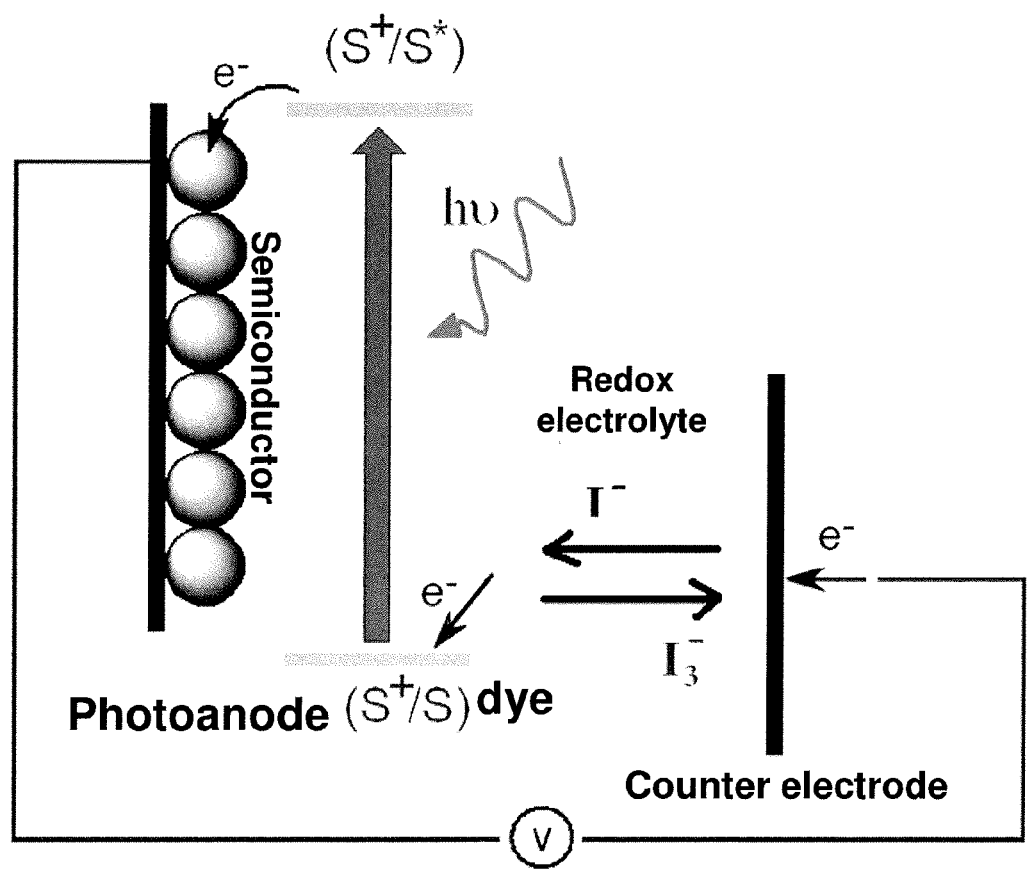
FIG. 12 illustrates the general principle of operation of a nanocrystalline $TiO_2$ dye-sensitized solar cell.

To determine the appropriate thickness of CuPc in the present device, photoanode deposited with different thickness of CuPc were tested in the range of 20 nm to 40 nm. The SEM images and respective photovoltaic properties ($V_{oc}$, $J_{sc}$, FF and PCE) of these photoanodes were shown in FIGS. 6a-6d, FIGS. 7a-7c, and FIGS. 11a-11d. Referring to FIG. 11, $V_{oc}$ of all devices almost remained as a constant of 0.73±0.02 V. FF was maintained at 60% when thickness of CuPc layer was no more than 30 nm, thereafter FF decreased to 54% when the CuPc thickness increased to 40 nm. The highest efficiency of 9.48% with the highest J can be achieved when the CuPc layer was 30 nm. Experimental results show that increasing, or decreasing, the thickness of CuPc would lead to lower performance of the DSSC device. There was an optimum device design for maximum J and PCE. This is in agreement with what has been stated that the total CuPc thickness should be optimally equals to the sum of the diffusion length of the excitons in the CuPc and the thickness of the quench region. With increasing thickness of CuPc in the photoanode, more electrons are generated under solar irradiation and they get transferred to the TiO$_2$ photo-anode via the N719, resulting in improved performance. However, when the thickness of CuPc exceeds the sum of the quench-layer thickness and the exciton diffusion length, the excess CuPc incurs extra resistance for holes transport (see FIG. 11) with consequence of retarding the regeneration of N719 by the electrons. The thickness of CuPc layer should be at least 5 nm with a preferred range of 10 and 50 nm. For a particular embodiment as shown in FIG. 11a-FIG. 11b, the thickness of CuPc shell gives maximum of PCE and $J_{sc}$.

Figure 6A:
FIG. 6a illustrates $TiO_2$ nanofibers without CuPc coating.
Figure 6B:
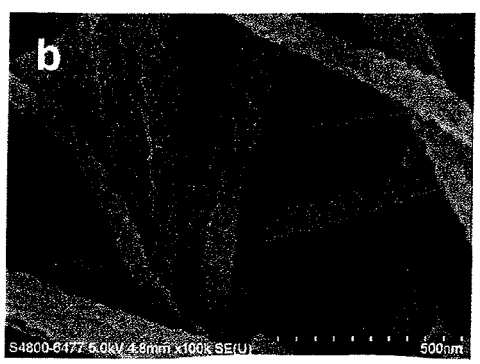
FIGS. 6b, 6c, and 6d illustrates N719 sensitized $TiO_2$ nanofiber having a CuPc deposition thickness of 20 nm, 30 nm, and 40 nm, respectively.
Figure 6C:
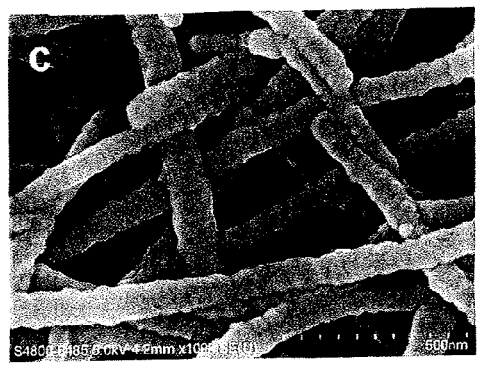
Figure 6D:
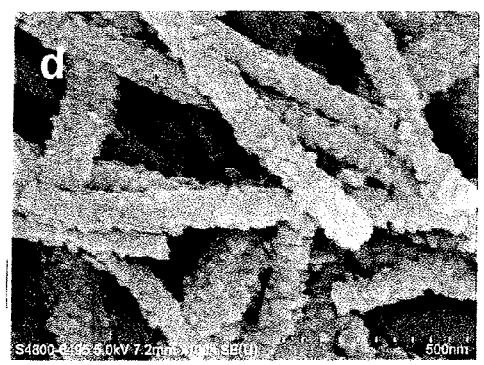

FIGS. 6b-6d show SEM images of CuPc coated N719 sensitized TiO$_2$ nanofiber with various thickness of CuPc deposition. More specifically, FIG. 6a illustrates TiO$_2$ nanofibers without CuPc coating; FIGS. 6b, 6c, and 6d illustrates N719 sensitized TiO$_2$ nanofiber having a CuPc deposition thickness of 20 nm, 30 nm, and 40 nm, respectively.

Figure 7A:
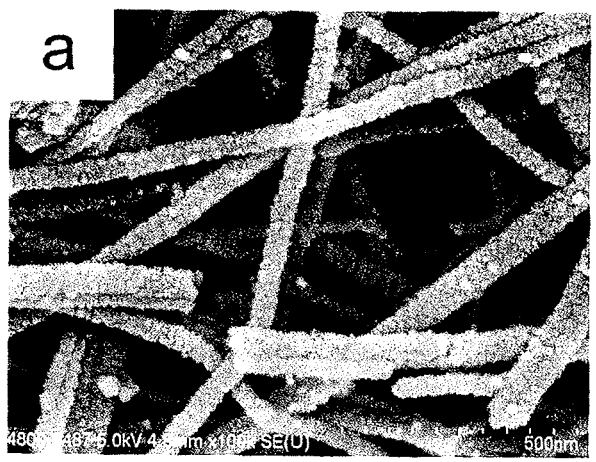
FIG. 7a illustrates scanning electron microscope (SEM) images of $TiO_2$ nanofiber sensitized with N719 before the coating of a CuPc layer.
Figure 7B:
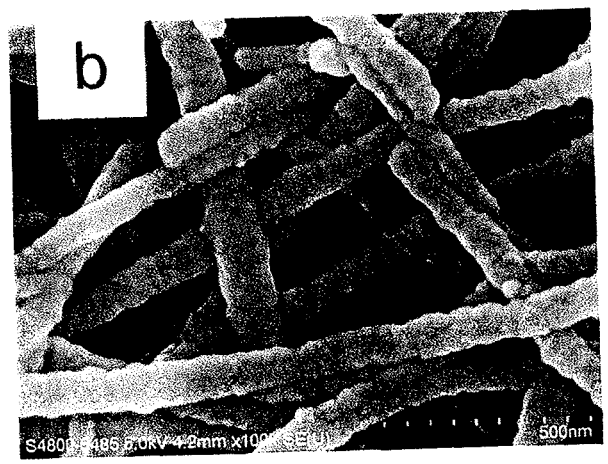
FIG. 7b illustrates a SEM image of $TiO_2$ nanofiber after a CuPc layer is deposited on the sensitized $TiO_2$ nanofibers in a core-shell structure.
Figure 7C:
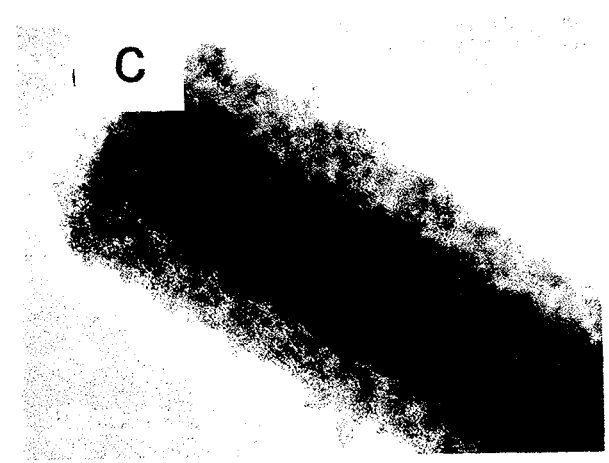
FIG. 7c illustrates a Transmission Electron Microscopy (TEM) image of $TiO_2$ nanofiber after a CuPc layer is coated on the sensitized $TiO_2$ nanofibers in a shell-like structure.

FIG. 7a illustrates scanning electron microscope (SEM) images of TiO$_2$ nanofiber sensitized with N719 before the coating of a CuPc layer. FIG. 7b illustrates a SEM image of TiO$_2$ nanofiber after a CuPc layer is deposited on the sensitized TiO$_2$ nanofibers in a core-shell structure. FIG. 7c illustrates a Transmission Electron Microscopy (TEM) image of TiO$_2$ nanofiber revealing the core-shell structure after a CuPc layer is coated on the sensitized TiO$_2$ nanofibers. Due to the high pore-volume and high permeability of the nanofiber film layer together with transporting CuPc in form of vapor (produced by thermal, chemical, or physical vapor deposition) deeply into the nanofiber film layer, CuPc is able to deposit on the sensitized nanofibers to form core-shell structures as shown in FIGS. 7b and 7c. The core-shell design is also able to improve and facilitate light harvesting, while reducing loss in energy conversion from electron-hole recombination.

Next, an exemplary fabrication process of a photoanode in accordance with one embodiment of the present invention is explained. To begin the fabrication process of the semiconductor nanofiber photoanode, a piece of FTO glass is prepared. Next, a first layer of TiO$_2$/PVP composite nanofibers are electrospun on the FTO glass from a precursor solution which contains titanium isopropoxide (TIP, 1.2 g), polyvinyipyrrolidone (PVP, 1 g), acetic acid (1 g) and ethanol (30 mL) Other materials with good affinity to titanium dioxide such as polyvinylacetate, polyvinylalcohol, polyethyleneoxide and the like may also be used to prepare the precursor solution. Besides the electrospinning method described above, the semiconductor nanofibers can be produced by other known techniques such as chemistry based solution method. In some embodiments, the average TiO2 nanofiber length in a distribution of TiO2 nanofibers ranges from nanometer scale to micro or millimeter scale. A similar nanofibers fabrication process is disclosed in U.S. patent application Ser. No. 13/244,957, entitled "Bilayer Dye-Sensitized Solar Cell and Fabrication Method Thereof", the information thereof is incorporated by reference herein in its entirety.

The diameter of the electrospun nanofibers can be influenced by processing parameters, and the diameter of the semiconductor (TiO$_2$) nanofibers can be controlled by adjusting the discharge amount, applied voltage for electrospinning, distance between positive electrode and ground, and the consistency of the electrospinning solution. The thicknesses of the nanofiber layer can be controlled by the electrospinning time.

Thereafter, a calcination step is performed on the nanofibers in 450° C. for 2 hours. After calcination, another piece of FTO glass is prepared and a thin layer of TiO$_2$ nanoparticles is formed on the FTO glass by doctor blading technique. Thereafter, the pilled semiconductor nanofiber film is placed on top of the nanoparticles layer in which the nanoparticles layer serves as a hole-blocking layer as well as a bonding layer. Subsequently, this photoanode is calcinated at 450° C. for 2 hours. The calcinated photoanode is further treated with an aqueous solution of TiCl$_4$ (40 mM) at 60° C. for 15 min. Next, the obtained TiO$_2$ nanofibers photoanode is sensitized in a solution of 0.03 mM Ru dye (N719) solution in absolute ethanol at 50° C. for 24 hours. The soaked photoanode is then washed with ethanol to remove unanchored dye molecules and then the photoanode is left dried. Thereafter, CuPc is deposited via vapor deposition method, which can be thermal, chemical or physical. The high "mobility" of the vapor of the infrared light absorption material can permeate/penetrate deeply into the photoanode, thereby depositing a shell-like structure onto the sensitized nanofibers in the photoanode. Otherwise, the deposition of the near-infrared dye might only take form of a thin layer or coating on the surface or periphery of the photoanode should the photoanode, made up of nanoparticles, be of low-permeability and low porosity. (In the latter, the core-shell structure will not be realized, and there would be difficulty to harness the benefits of more efficient indirect charge transfer as well as the reduced recombination.) The deposition method will be explained in more details below in connection with the experimental setup.

Figure 8A:
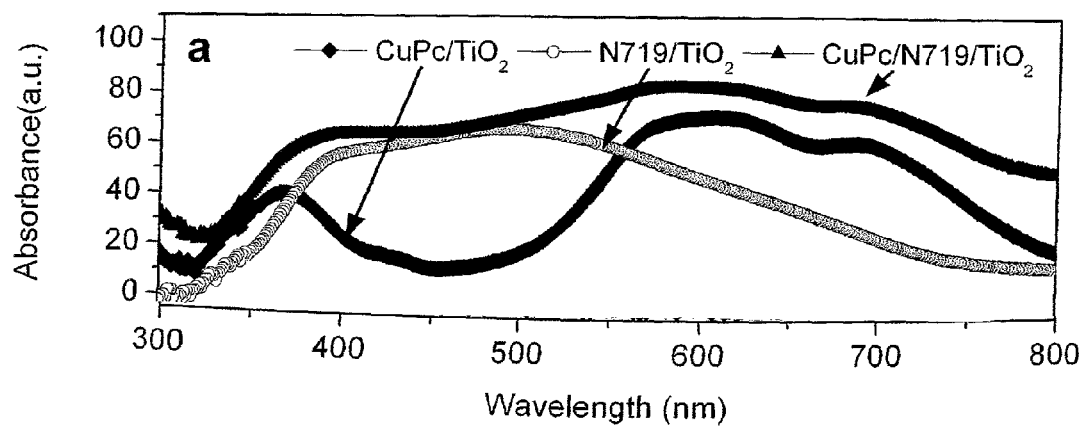
FIG. 8a illustrates absorption spectrums of photoanode with $N719/TiO_2$, $CuPc/TiO_2$, $CuPc/N719/TiO_2$ structures.
Figure 8B:
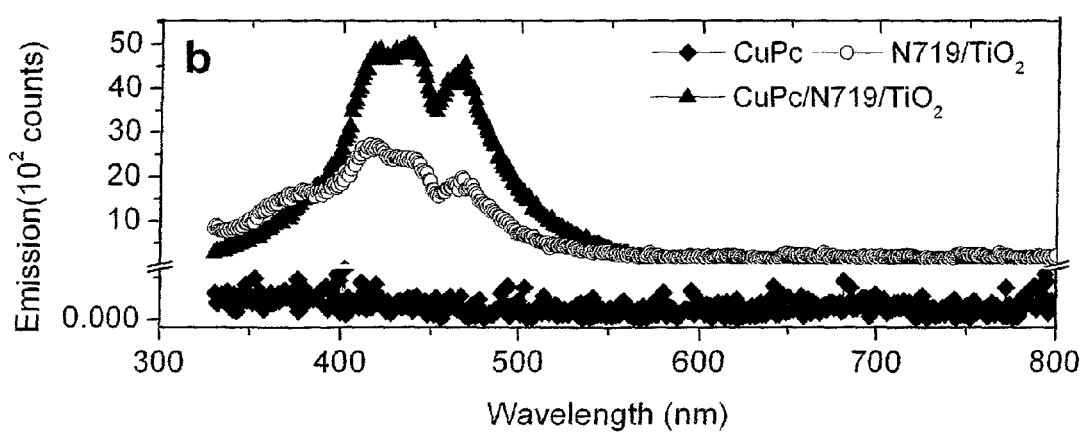
FIG. 8b illustrates emission spectrum of CuPc and $N719/TiO_2$.

FIG. 8a illustrates an experimental result of the absorption spectrum of sensitized photoanodes having N719/TiO$_2$, CuPc/TiO$_2$ and CuPc/N719/TiO$_2$ structure, respectively. The absorption bandwidth of a single N719 sensitized TiO$_2$ was in the range of 400 nm to 550 nm. After inducing the shell layer, CuPc, the absorption spectrum can be broadened up to the near-infrared range. Furthermore, the photoluminescence (PL) emission spectrums of CuPc, N719/TiO$_2$ and CuPc/N719/TiO$_2$ photoanodes are shown in FIG. 8b which exhibits no evident emission occurring in the wavelength of 330 to 800 nm for CuPc. On the other hand, the emission intensity of N719/TiO$_2$ was enhanced with introduction of CuPc, which suggests photons were absorbed by CuPc and subsequently transferred to N719, resulting in enhanced PL emission. Given there is no overlap between the absorption spectrum of N719 and the emission spectrum of CuPc, the FRET process, which is highly dependent on the overlap, according to Frster theory, does not work efficiently in the present N719-sensitized TiO$_2$ core—CuPC shell device.

Figure 9:
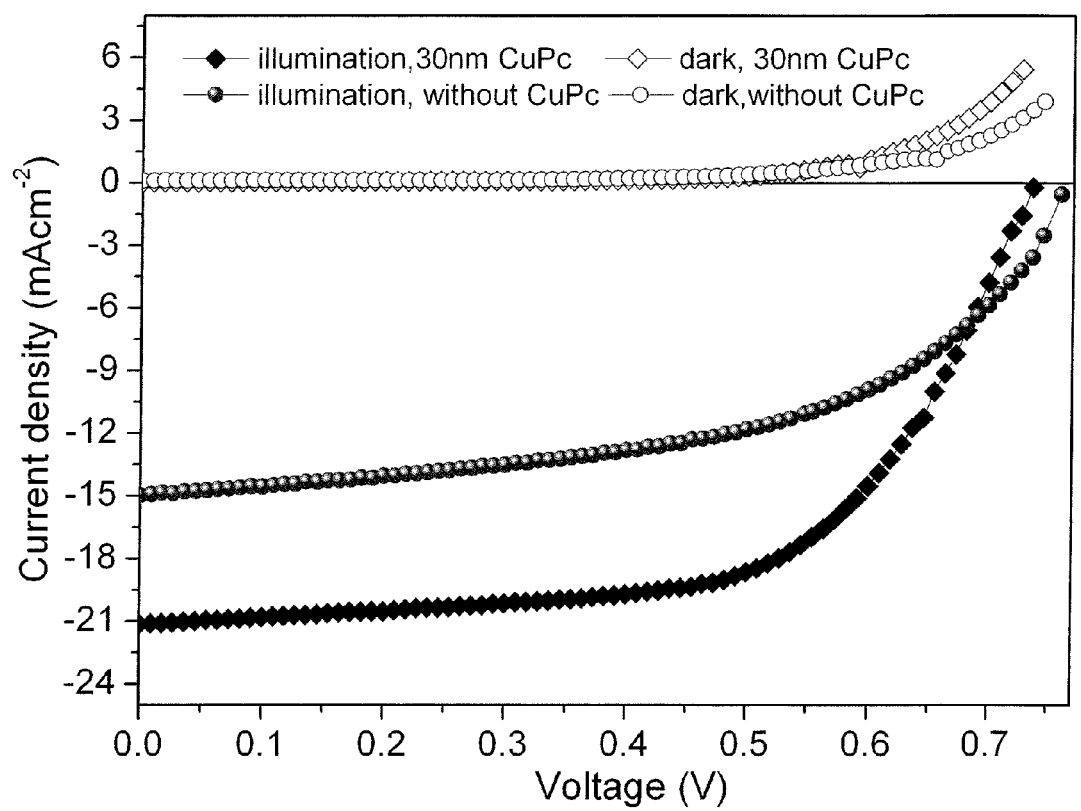
FIG. 9 illustrates photocurrent density-voltage (J-V) characteristics of DSSC devices with and without a CuPc layer.

FIG. 9 shows an experimental result of photocurrent density-voltage (J-V) characteristics of DSSC with and without CuPc layer (30 nm) under AM1.5 (100 mWcm$^{-2}$) illumination, and related data is shown in Table 1 below:

TABLE 1

Photovoltaic characteristics of DSSC with and without CuPc

|  | 30 nm CuPc | Without CuPc | Change % |
|---|---|---|---|
| $J_{sc}$ (mAcm$^{-2}$) | 21.12 | 14.97 | 41.08 |
| $V_{oc}$ (V) | 0.74 | 0.75 | -1.33 |
| FF (%) | 60.65 | 56.91 | 6.57 |
| PCE (%) | 9.48 | 6.39 | 48.36 |
| $R_s$ (Ωcm$^2$) | 2.34 | 10.07 | -76.76 |
| $R_p$ (Ωcm$^2$) | 641.5 | 414.8 | 54.65 |

The thickness of photoanode (excluding FTO glass) in these devices was maintained at 13±1 μm. The open circuit voltage ($V_{oc}$), at 0.74-0.75 V, remained nearly unchanged for DSSC with or without CuPc deposition (see in Table 1). The device sensitized with only N719 has a PCE of 6.39% while DSSC with a 30 nm CuPc shell demonstrated an enhancement up to 9.48% PCE, a 48% increase in device performance. The improvement primarily attributed to the increase in both short-circuits current density (J) and fill factor (FF). However, for reference the device with photoanode of only CuPc/TiO$_2$ was found to have extremely low J and PCE, respectively, 0.67 mAcm$^{-2}$ and 0.18%, as shown in FIG. 5. It is known that CuPc with multiple and symmetrical carboxyl groups is easy to synthesize however sensitizing TiO$_2$ is difficult as the electron cannot direct inject from CuPc into the CB of TiO$_2$ due to the wide band gap. Thus, the device with CuPc/TiO$_2$ photoanode shows extremely low PCE. The improved performance as evident from the very high J realized through introducing the CuPc shell was due to the indirect charge transfer from the CuPc, through N719, to the CB of TiO$_2$. Therefore, there were two routes for charge generation and transport incorporated in the present novel system. Besides harvesting light, N719 also functions as a charge carrier or transport channel connecting CuPc and TiO$_2$.

Figure 10A:
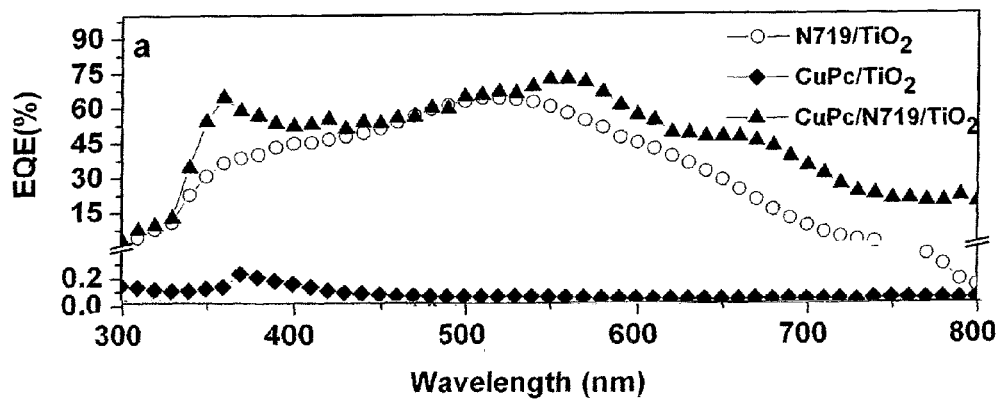
FIG. 10a illustrates EQE versus wavelength of the DSSC with and without CuPc (30 nm)
Figure 10B:
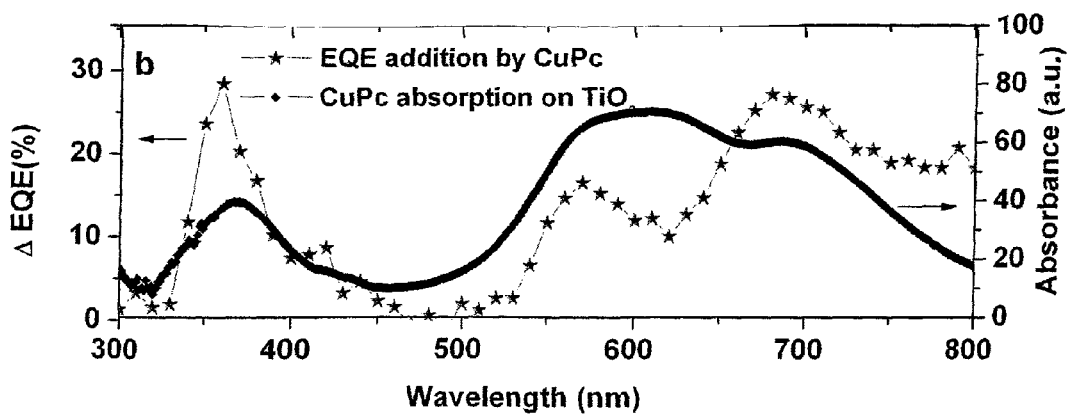
FIG. 10b illustrates EQE addition (AEQE) caused by 30 nm CuPc and corresponding absorption spectrum of CuPc on $TiO_2$.

The 48% enhancement in device performance is mainly due to increase of $J_{sc}$ which can be examined by an increase in the external quantum efficiency (EQE) in the two wavelength regimes: 350 to 400 nm and 550 to 800 nm as depicted in FIG. 10a. The increase of EQE is attributed to the introduced CuPc that can absorb photons in these regions for additional charge generation. As shown in FIG. 10b, the ECE enhancement, ΔEQE, was calculated based on the difference between EQE of the device with and without CuPc. The ΔEQE has three peaks, respectively, at 355, 570 and 700 nm, corresponding to 28%, 15%, and 27% enhancement in EQE that matches the absorption spectrum of pure CuPc very well. The foregoing analysis clearly reveals the effect of CuPc on performance of the DSSC device.

The experimental data demonstrate the viability of application of the present photoanode with core-shell structure in DSSC. The core (TiO$_2$) sensitized with a dye (i.e., first light absorption material) and the shell made of another dye (i.e., second light absorption material) has the complementary absorption region thus could broaden the absorption spectrum of device. Furthermore, the shell can suppress recombination process in the device due to the organized level energy between two dyes. Realization of high efficiency device in excess 15%, a core-shell photoanode with much stronger dye instead of CuPc would be a more viable solution for deploying this type of DSSC device for renewable energy in the future.

Experimental Setup

Preparation of the Novel Core-Shell Photoanode:

A TiO$_2$ nanofiber photoanode (3 mm×3 mm) with the thickness of (13±1) μm is prepared. The prepared TiO$_2$ nanofiber film was first treated with an aqueous solution of TiCl$_4$ (40 mM) at 60° C. for 15 min. After treatment, washing with ethanol and drying in vacuum at 80° C., and immersed in a solution of 0.03 mM N719 in absolute ethanol at 55° C. for 24 hours. Prior to loading into vacuum chamber, the soaked photoanode was washed with ethanol to remove "unanchored" dye. A CuPc layer was deposited on N719 sensitized TiO$_2$ nanofiber photoanode using thermal evaporation under a pressure of <10$^{-6}$ Torr at a deposition of around 0.5 Å/s, which was rotated at a rate during deposition. A 6 MHz gold crystal monitor was used to determine film thickness and deposition rate.

The morphology of the photoanode was investigated by images obtained from scanning electron microscopy (SEM, Hitachi S4800) and transmission electron microscope (TEM, JEOL 2100F). The core-shell TEM samples were prepared by directly filing the CuPc/N719/TiO$_2$ photoanode by graphite-covered copper grid.

The absorption spectrum of N719/TiO$_2$, CuPc/TiO$_2$ and CuPc/N719/TiO$_2$ photoanodes was measured by an Agilent Varian Cary 4000 UV/VIS/NIR spectrophotometer. Photoluminescence (PL) data was measured at room temperature using an Edinburgh FLSP920 spectrophotometer with an incidence-and-detection angle of 45°. The emission spectrum was measured at an excitation using a 32-nm monochromatic filter and an increment of 1 nm was adopted for data collection.

Solar Cell Fabrication and Characterization:

Platinum-sputtered FTO glass was used as the counter electrode. The counter electrode and dyes anchored TiO$_2$ photoanode were assembled into a sandwich prototype with hot-melt film (Surlyn, DuPont, 25 μm). The internal space of the cell was filled with a liquid electrolyte, which consisted of a mixture of 0.6 M 1-methy-3-propylimidazolium iodide (PMII), 0.05 M LiI, 0.05 M I$_2$, and 0.5 M 4-tert-butyl pyridine (TBP) in acetonitrile. The prepared DSSC device was subject to illumination of AM1.5G 100 mWcm$^{-2}$ from a solar simulator ABET SUN 2000 with power density calibrated by a silicon reference cell (NIST). The performance of the DSSC device was monitored by a power meter (Keithley 2400 digital source meter) throughout the testing. The external quantum efficiency (EQE) values were measured with an EQE system equipped with a xenon lamp (Oriel 66902, 300 W), a monochrometer (Newport 66902), a Si detector (Oriel 76175_71580) and a dual-channel power meter (Newport 2931_C).

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

What is claimed is:

1. A method of producing an electrode of a dye-sensitized solar cell, the method comprising:
    dispersing a plurality of semiconductor nanoparticles on a transparent electrically conductive substrate;
    dispersing a plurality of semiconductor nanofibers on the semiconductor nanoparticle layer;
    adsorbing onto all sides of the semiconductor nanofibers a first light absorption material, thereby sensitizing the semiconductor nanofibers, wherein the light absorption material has a first light absorption bandwidth; and
    depositing a second light absorption material in contact with and forming respective shells on the respective semiconductor nanofibers on which the first light absorption material is adsorbed, wherein the second light absorption material has a second light absorption bandwidth complementary to the first light absorption bandwidth.

2. The method of claim 1, wherein the semiconductor nanofibers have a porous structure.

3. The method of claim 1, including depositing the second light absorption material on the first light absorption material via a deep penetration technique.

4. The method of claim 3, wherein the deep penetration technique is selected from the group consisting of thermal, chemical, and physical vapor deposition methods.

5. The method of claim 1, wherein
    the first light absorption material has an energy level that is higher than an energy level of a conduction band of the semiconductor nanofibers, and
    the second light absorption material has an energy level that is higher than the energy level of the first light absorption material.

6. A method of producing an electrode of a dye-sensitized solar cell, the method comprising:
    dispersing a plurality of semiconductor nanoparticles on a transparent electrically conductive substrate;
    dispersing a plurality of semiconductor nanofibers on the semiconductor nanoparticle layer;
    adsorbing onto all sides of the semiconductor nanofibers a first light absorption material, thereby sensitizing the semiconductor nanofibers, wherein the light absorption material has a first light absorption bandwidth and an energy level higher than that of a conduction band of the semiconductor nanofibers; and
    depositing additional light absorption materials, successively, and forming a shell structure, with each successively deposited light absorption material being deposited on a previously deposited light absorption material, each successively deposited light absorption material having a higher energy level than the light absorption material previously deposited.

7. The method of claim 6, wherein each of the successively deposited light absorption materials has a corresponding light absorption bandwidth that is complementary to a light absorption bandwidth of the previously deposited light absorption material materials.

* * * * *